(12) United States Patent
Li et al.

(10) Patent No.: US 11,715,512 B2
(45) Date of Patent: *Aug. 1, 2023

(54) APPARATUSES AND METHODS FOR DYNAMIC TARGETED REFRESH STEALS

(71) Applicant: MICRON TECHNOLOGY, INC., Boise, ID (US)

(72) Inventors: Liang Li, Shanghai (CN); Yu Zhang, Shanghai (CN); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/654,035

(22) Filed: Mar. 8, 2022

(65) Prior Publication Data
US 2022/0189539 A1    Jun. 16, 2022

Related U.S. Application Data

(63) Continuation of application No. 16/655,110, filed on Oct. 16, 2019, now Pat. No. 11,302,377.

(51) Int. Cl.
| | |
|---|---|
| *G11C 7/00* | (2006.01) |
| *G11C 11/406* | (2006.01) |
| *G11C 29/20* | (2006.01) |

(52) U.S. Cl.
CPC ... *G11C 11/40622* (2013.01); *G11C 11/40611* (2013.01); *G11C 11/40615* (2013.01); *G11C 11/40618* (2013.01); *G11C 29/20* (2013.01)

(58) Field of Classification Search
CPC ........ G11C 11/40622; G11C 11/40611; G11C 11/40615; G11C 11/40618; G11C 29/20
(Continued)

(56) References Cited

U.S. PATENT DOCUMENTS 5,299,159 A   3/1994 Balistreri et al.
5,654,929 A   8/1997 Mote, Jr.
(Continued)

FOREIGN PATENT DOCUMENTS

CN   101026003 A   8/2007
CN   101038785 A   9/2007
(Continued)

OTHER PUBLICATIONS

U.S. Appl. No. 17/662,733, titled "Apparatuses, Systems, and Methods for Identifying Victim Rows in a Memorydevice Which Cannot Be Simultaneously Refreshed" filed May 10, 2022, pp. all pages of the application as filed.
(Continued)

*Primary Examiner* — Viet Q Nguyen
(74) *Attorney, Agent, or Firm* — Dorsey & Whitney LLP

(57) ABSTRACT

Embodiments of the disclosure are drawn to apparatuses, systems, and methods for dynamic targeted refresh steals. A memory bank may receive access commands and then periodically enter a refresh mode, where auto refresh operations and targeted refresh operations are performed. The memory bank may receive a refresh management command based on a count of access commands directed to the memory bank. Responsive to the refresh management signal, a panic targeted refresh operation may be performed on the memory bank. A number of times the refresh management signal was issued may be counted, and based on that count a next periodic targeted refresh operation may be skipped.

20 Claims, 7 Drawing Sheets

(58) Field of Classification Search
USPC .......................................................... 365/222
See application file for complete search history.

(56) References Cited

U.S. PATENT DOCUMENTS

| | | | |
|---|---|---|---|
| 5,699,297 A | 12/1997 | Yamazaki et al. |
| 5,867,442 A | 2/1999 | Kim et al. |
| 5,933,377 A | 8/1999 | Hidaka |
| 5,943,283 A | 8/1999 | Wong et al. |
| 5,956,288 A | 9/1999 | Bermingham et al. |
| 5,959,923 A | 9/1999 | Matteson et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,535,980 B1 | 3/2003 | Kumar et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,526,260 B2 | 9/2013 | Pyeon |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Venkata |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 * | 1/2019 | Morgan ................... G11C 7/24 |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 * | 6/2020 | Brown ................ G06F 11/3037 |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |

(56) References Cited

U.S. PATENT DOCUMENTS

| | | | |
|---|---|---|---|
| 11,315,620 B2 | 4/2022 | Ishikawa et al. | |
| 11,320,377 B2 * | 5/2022 | Chen .................... | G01N 21/645 |
| 11,348,631 B2 | 5/2022 | Wu et al. | |
| 11,380,382 B2 | 7/2022 | Zhang et al. | |
| 11,417,383 B2 | 8/2022 | Jenkinson et al. | |
| 11,532,346 B2 | 12/2022 | Brown et al. | |
| 11,557,331 B2 | 1/2023 | Mitsubori et al. | |
| 2001/0008498 A1 | 7/2001 | Ooishi | |
| 2002/0026613 A1 | 2/2002 | Niiro | |
| 2002/0181301 A1 | 12/2002 | Takahashi et al. | |
| 2002/0191467 A1 | 12/2002 | Matsumoto et al. | |
| 2003/0026161 A1 | 2/2003 | Yamaguchi et al. | |
| 2003/0063512 A1 | 4/2003 | Takahashi et al. | |
| 2003/0067825 A1 | 4/2003 | Shimano et al. | |
| 2003/0081483 A1 | 5/2003 | De Paor et al. | |
| 2003/0123301 A1 | 7/2003 | Jang et al. | |
| 2003/0161208 A1 | 8/2003 | Nakashima et al. | |
| 2003/0193829 A1 | 10/2003 | Morgan et al. | |
| 2003/0231540 A1 | 12/2003 | Lazar et al. | |
| 2004/0004856 A1 | 1/2004 | Sakimura et al. | |
| 2004/0008544 A1 | 1/2004 | Shinozaki et al. | |
| 2004/0022093 A1 | 2/2004 | Lee | |
| 2004/0024955 A1 | 2/2004 | Patel | |
| 2004/0114446 A1 | 6/2004 | Takahashi et al. | |
| 2004/0130959 A1 | 7/2004 | Kawaguchi | |
| 2004/0184323 A1 | 9/2004 | Mori et al. | |
| 2004/0218431 A1 | 11/2004 | Chung et al. | |
| 2005/0002268 A1 | 1/2005 | Otsuka et al. | |
| 2005/0041502 A1 | 2/2005 | Perner | |
| 2005/0105362 A1 | 5/2005 | Choi et al. | |
| 2005/0108460 A1 | 5/2005 | David | |
| 2005/0213408 A1 | 9/2005 | Shieh | |
| 2005/0243627 A1 | 11/2005 | Lee et al. | |
| 2005/0265104 A1 | 12/2005 | Remaklus et al. | |
| 2006/0018174 A1 | 1/2006 | Park et al. | |
| 2006/0083099 A1 | 4/2006 | Bae et al. | |
| 2006/0087903 A1 | 4/2006 | Riho et al. | |
| 2006/0104139 A1 | 5/2006 | Hur et al. | |
| 2006/0176744 A1 | 8/2006 | Stave | |
| 2006/0198220 A1 | 9/2006 | Yoon et al. | |
| 2006/0215474 A1 | 9/2006 | Hokenmaier | |
| 2006/0233012 A1 | 10/2006 | Sekiguchi et al. | |
| 2006/0262616 A1 | 11/2006 | Chen | |
| 2006/0262617 A1 | 11/2006 | Lee | |
| 2006/0268643 A1 | 11/2006 | Schreck et al. | |
| 2007/0002651 A1 | 1/2007 | Lee | |
| 2007/0008799 A1 | 1/2007 | Dono et al. | |
| 2007/0014175 A1 | 1/2007 | Min et al. | |
| 2007/0028068 A1 | 2/2007 | Golding et al. | |
| 2007/0030746 A1 | 2/2007 | Best et al. | |
| 2007/0033339 A1 | 2/2007 | Best et al. | |
| 2007/0147154 A1 | 6/2007 | Lee | |
| 2007/0165042 A1 | 7/2007 | Yagi | |
| 2007/0237016 A1 | 10/2007 | Miyamoto et al. | |
| 2007/0263442 A1 | 11/2007 | Cornwell et al. | |
| 2007/0297252 A1 | 12/2007 | Singh | |
| 2008/0028260 A1 | 1/2008 | Oyagi et al. | |
| 2008/0031068 A1 | 2/2008 | Yoo et al. | |
| 2008/0126893 A1 | 5/2008 | Harrand et al. | |
| 2008/0130394 A1 | 6/2008 | Dono et al. | |
| 2008/0181048 A1 | 7/2008 | Han | |
| 2008/0212386 A1 | 9/2008 | Riho | |
| 2008/0224742 A1 | 9/2008 | Pomichter | |
| 2008/0253212 A1 | 10/2008 | Iida et al. | |
| 2008/0253213 A1 | 10/2008 | Sato et al. | |
| 2008/0266990 A1 | 10/2008 | Loeffler | |
| 2008/0270683 A1 | 10/2008 | Barth et al. | |
| 2008/0306723 A1 | 12/2008 | De Ambroggi et al. | |
| 2008/0316845 A1 | 12/2008 | Wang et al. | |
| 2009/0021999 A1 | 1/2009 | Tanimura et al. | |
| 2009/0052264 A1 | 2/2009 | Hong et al. | |
| 2009/0059641 A1 | 3/2009 | Jeddeloh | |
| 2009/0073760 A1 | 3/2009 | Betser et al. | |
| 2009/0161468 A1 | 6/2009 | Fujioka | |
| 2009/0168571 A1 | 7/2009 | Pyo et al. | |
| 2009/0185440 A1 | 7/2009 | Lee | |
| 2009/0201752 A1 | 8/2009 | Riho et al. | |
| 2009/0228739 A1 | 9/2009 | Cohen et al. | |
| 2009/0251971 A1 | 10/2009 | Futatsuyama | |
| 2009/0296510 A1 | 12/2009 | Lee et al. | |
| 2010/0005217 A1 | 1/2010 | Jeddeloh | |
| 2010/0005376 A1 | 1/2010 | Laberge et al. | |
| 2010/0061153 A1 | 3/2010 | Yen et al. | |
| 2010/0074042 A1 | 3/2010 | Fukuda et al. | |
| 2010/0097870 A1 | 4/2010 | Kim et al. | |
| 2010/0110809 A1 | 5/2010 | Kobayashi et al. | |
| 2010/0110810 A1 | 5/2010 | Kobayashi | |
| 2010/0124138 A1 | 5/2010 | Lee et al. | |
| 2010/0128547 A1 | 5/2010 | Kagami | |
| 2010/0131812 A1 | 5/2010 | Mohammad | |
| 2010/0141309 A1 | 6/2010 | Lee | |
| 2010/0157693 A1 | 6/2010 | Iwai et al. | |
| 2010/0182862 A1 | 7/2010 | Teramoto | |
| 2010/0182863 A1 | 7/2010 | Fukiage | |
| 2010/0329069 A1 | 12/2010 | Ito et al. | |
| 2011/0026290 A1 | 2/2011 | Noda et al. | |
| 2011/0055495 A1 | 3/2011 | Remaklus, Jr. et al. | |
| 2011/0069572 A1 | 3/2011 | Lee et al. | |
| 2011/0122987 A1 | 5/2011 | Neyer | |
| 2011/0134715 A1 | 6/2011 | Norman | |
| 2011/0216614 A1 | 9/2011 | Hosoe | |
| 2011/0225355 A1 | 9/2011 | Kajigaya | |
| 2011/0299352 A1 | 12/2011 | Fujishiro et al. | |
| 2011/0310648 A1 | 12/2011 | Iwamoto et al. | |
| 2012/0014199 A1 | 1/2012 | Narui | |
| 2012/0059984 A1 | 3/2012 | Kang et al. | |
| 2012/0151131 A1 | 6/2012 | Kilmer et al. | |
| 2012/0155173 A1 | 6/2012 | Lee et al. | |
| 2012/0155206 A1 | 6/2012 | Kodama et al. | |
| 2012/0213021 A1 | 8/2012 | Riho et al. | |
| 2012/0254472 A1 | 10/2012 | Ware et al. | |
| 2012/0287727 A1 | 11/2012 | Wang | |
| 2012/0307582 A1 | 12/2012 | Marumoto et al. | |
| 2012/0327734 A1 | 12/2012 | Sato | |
| 2013/0003467 A1 | 1/2013 | Klein | |
| 2013/0003477 A1 | 1/2013 | Park et al. | |
| 2013/0028034 A1 | 1/2013 | Fujisawa | |
| 2013/0051157 A1 | 2/2013 | Park | |
| 2013/0051171 A1 | 2/2013 | Porter et al. | |
| 2013/0077423 A1 | 3/2013 | Lee | |
| 2013/0173971 A1 | 7/2013 | Zimmerman | |
| 2013/0254475 A1 | 9/2013 | Perego et al. | |
| 2013/0279284 A1 | 10/2013 | Jeong | |
| 2013/0304982 A1 | 11/2013 | Jung et al. | |
| 2014/0006700 A1 | 1/2014 | Schaefer et al. | |
| 2014/0006703 A1 | 1/2014 | Bains et al. | |
| 2014/0006704 A1 | 1/2014 | Greenfield et al. | |
| 2014/0013169 A1 | 1/2014 | Kobla et al. | |
| 2014/0013185 A1 | 1/2014 | Kobla et al. | |
| 2014/0016422 A1 | 1/2014 | Kim et al. | |
| 2014/0022858 A1 | 1/2014 | Chen et al. | |
| 2014/0043888 A1 | 2/2014 | Chen et al. | |
| 2014/0050004 A1 | 2/2014 | Mochida | |
| 2014/0078841 A1 | 3/2014 | Chopra | |
| 2014/0078842 A1 | 3/2014 | Oh et al. | |
| 2014/0089576 A1 | 3/2014 | Bains et al. | |
| 2014/0089758 A1 | 3/2014 | Kwok et al. | |
| 2014/0095780 A1 | 4/2014 | Bains et al. | |
| 2014/0095786 A1 | 4/2014 | Moon et al. | |
| 2014/0119091 A1 | 5/2014 | You et al. | |
| 2014/0143473 A1 | 5/2014 | Kim et al. | |
| 2014/0169114 A1 | 6/2014 | Oh | |
| 2014/0177370 A1 | 6/2014 | Halbert et al. | |
| 2014/0181453 A1 | 6/2014 | Jayasena et al. | |
| 2014/0185403 A1 | 7/2014 | Lai | |
| 2014/0189228 A1 | 7/2014 | Greenfield et al. | |
| 2014/0219042 A1 | 8/2014 | Yu et al. | |
| 2014/0219043 A1 | 8/2014 | Jones et al. | |
| 2014/0237307 A1 | 8/2014 | Kobla et al. | |
| 2014/0241099 A1 | 8/2014 | Seo et al. | |
| 2014/0254298 A1 | 9/2014 | Dally | |
| 2014/0281206 A1 | 9/2014 | Crawford et al. | |
| 2014/0281207 A1 | 9/2014 | Mandava et al. | |
| 2014/0293725 A1 | 10/2014 | Best et al. | |

(56) References Cited

U.S. PATENT DOCUMENTS

| | | |
|---|---|---|
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0117030 A1 | 4/2017 | Fisch et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |

(56) References Cited

U.S. PATENT DOCUMENTS

| | | |
|---|---|---|
| 2020/0185026 A1 | 6/2020 | Yun et al. |
| 2020/0194050 A1 | 6/2020 | Akamatsu |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0406170 A1 | 12/2021 | Jung et al. |
| 2022/0059153 A1 | 2/2022 | Zhang et al. |
| 2022/0059158 A1 | 2/2022 | Wu et al. |
| 2022/0093165 A1 | 3/2022 | Mitsubori et al. |
| 2022/0165328 A1 | 5/2022 | Ishikawa et al. |
| 2022/0199144 A1 | 6/2022 | Roberts |
| 2022/0270670 A1 | 8/2022 | Wu et al. |

FOREIGN PATENT DOCUMENTS

| | | |
|---|---|---|
| CN | 101067972 A | 11/2007 |
| CN | 104350546 A | 2/2015 |
| CN | 104733035 A | 6/2015 |
| CN | 104981874 A | 10/2015 |
| CN | 105529047 A | 4/2016 |
| CN | 106710621 A | 5/2017 |
| CN | 107025927 A | 8/2017 |
| CN | 107871516 A | 4/2018 |
| CN | 108154895 A | 6/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| TW | 201801079 A | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

U.S. Appl. No. 17/731,529, titled "Apparatuses and Methods for Access Based Refresh Dperations"; filed Apr. 28, 2022; pp. all pages of the application as filed.

U.S. Appl. No. 17/731,645, titled "Apparatuses and Methods for Access Based Targeted Refresh Operations", filed Apr. 28, 2022; pp. all pages of application as filed.

U.S. Appl. No. 18/064,773, filed Dec. 12, 2022, titled, "Apparatuses and Methods for Access Based Refresh Timing," pp. all pages of application as filed.

International Application No. PCT/US20/23689, titled "Semiconductor Device Having Cam that Stores Address Signals", dated Mar. 19, 2020, pp. all pages of application as filed.

U.S. Appl. No. 16/797,658, titles "Apparatuses and Methods for Controlling Refresh Operations", filed Feb. 21, 2020, pp. all pages of application as filed.

U.S. Appl. No. 16/818,981, titled "Apparatuses and Methods for Staggered Timing of Targeted Refresh Operations" filed Mar. 13, 2020, pp. all pages of application as filed.

U.S. Appl. No. 16/824,460, titled "Semiconductor Device Performing Row Hammer Refresh Operation", dated Mar. 19, 2020, pp. all pages of application as filed.

U.S. Appl. No. 16/025,844, titled "Apparatus and Methods for Triggering Row Hammer Address Sampling", filed Jul. 2, 2018, pp. all pages of application as filed.

U.S. Appl. No. 16/783,063, titled "Apparatus and Methods for Triggering Row Hammer Address Sampling", dated Feb. 5, 2020, pp. all pages of application as filed.

U.S. Appl. No. 16/805,197, titled "Apparatuses and Methods for Calculating Row Hammer Refresh Addresses in a Semiconductor Device", dated Feb. 28, 2020, pp. all pages of application as filed.

U.S. Appl. No. 16/232,837, titled "Apparatuses and Methods for Distributed Targeted Refresh Operations", filed Dec. 26, 2018, pp. all pages of application as filed.

U.S. Appl. No. 16/818,989, titled "Semiconductor Device Performing Row Hammer Refresh Operation", dated Mar. 13, 2020, pp. all pages of application as filed.

U.S. Appl. No. 16/268,818, titled "Apparatuses and Methods for Managing Row Access Counts", filed Feb. 6, 2019, pp. all pages of application as filed.

U.S. Appl. No. 16/286,187 titled "Apparatuses and Methods for Memory Mat Refresh Sequencing" filed Feb. 26, 2019, pp. all pages of application as filed.

U.S. Appl. No. 16/084,119, titled "Apparatuses and Methods for Pure-Time, Self Adopt Sampling for Row Hammer Refresh Sampling", filed Sep. 11, 2018, pp. all pages of application as filed.

U.S. Appl. No. 16/886,284 titled "Apparatuses and Methods for Access Based Refresh Timing" filed May 28, 2020, pp. all pages of application as filed.

U.S. Appl. No. 16/886,284, titled "Apparatuses and Methods for Access Based Refresh Timing", dated May 28, 2020, pp. all pages of application as filed.

U.S. Appl. No. 16/358,587, titled "Semiconductor Device Having Cam that Stores Address Signals", dated Mar. 19, 2019, pp. all pages of application as filed.

U.S. Appl. No. 16/375,716 titled "Apparatuses and Methods for Staggered Timing of Targeted Refresh Operations" filed Apr. 4, 2019, pp. all pages of application as filed.

U.S. Appl. No. 16/411,573 titled "Apparatuses, Systems, and Methods for a Content Addressable Memory Cell" filed May 14, 2019, pp. all pages of application as filed.

U.S. Appl. No. 16/428,625 titled "Apparatuses and Methods for Tracking Victim Rows" filed May 31, 2019, pp. all pages of application as filed.

U.S. Appl. No. 16/432,604 titled "Apparatuses and Methods for Staggered Timing of Skipped Refresh Operations" filed Jun. 5, 2019, pp. all pages of application as filed.

U.S. Appl. No. 17/008,396 titled "Apparatuses and Methods for Staggered Timing of Targeted Refresh Operations" filed Aug. 31, 2020, pp. all pages of application as filed.

U.S. Appl. No. 16/513,400 titled "Apparatuses and Methods for Tracking Row Accesses" filed Jul. 16, 2019, pp. all pages of application as filed.

U.S. Application No. 16/548,027 titled "Apparatuses, Systems, and Methods for Analog Row Access Rate Determination" filed Aug. 22, 2019, pp. all pages of application as filed.

U.S. Appl. No. 16/549,942 titled "Apparatuses and Methods for Lossy Row Access Counting" filed Aug. 23, 2019, pp. all pages of application as filed.

(56) References Cited

OTHER PUBLICATIONS

U.S. Appl. No. 16/546,152 titled "Apparatuses and Methods for Analog Row Access Tracking" filed Aug. 20, 2019, pp. all pages of application as filed.
U.S. Appl. No. 16/549,411 titled "Apparatuses and Methods for Dynamic Refresh Allocation" filed Aug. 23, 2019, pp. all pages of application as filed.
U.S. Appl. No. 16/655,110 tilted "Apparatuses and Methods for Dynamic Targeted Refresh Steals" filed Oct. 16, 2019, pp. all pages of application as filed.
U.S. Appl. No. 17/186,913 titled "Apparatuses and Methods for Dynamic Refresh Allocation" filed Feb. 26, 2021, pp. all pages of application as filed.
U.S. Appl. No. 17/187,002 titled "Apparatuses and Methods for Staggered Timing of Targeted Refresh Operations" filed Feb. 26, 2021, pp. all pages of application as filed.
U.S. Appl. No. 17/347,957 titled "Apparatuses and Methods for Controlling Steal Rates" filed Jun. 15, 2021, pp. all pages of application as filed.
International Application No. PCT/US19/40169 titled "Apparatus and Methods for Triggering Row Hammer Address Sampling" filed Jul. 1, 2019, pp. all pages of application as filed.
International Application No. PCT/US19/64028, titled "Semiconductor Device Performing Row Hammer Refresh Operation", dated Dec. 2, 2019, pp. all pages of application as filed.
International Application No. PCT/US20/26689, titled "Apparatuses and Methods for Staggered Timing of Targeted Refresh Operations", dated Apr. 3, 2020, pp. all pages of application as filed.
International Application No. PCT/US20/32931, titled "Apparatuses and Methods for Controlling Steal Rates", dated May 14, 2029, pp. all pages of application as filed.
U.S. Appl. No. 16/788,657, titled "Semiconductor Device Performing Row Hammer Refresh Operation", dated Feb. 12, 2020, pp. all pages of application as filed.
U.S. Appl. No. 17/324,621 titled "Apparatuses and Methods for Pure-Time, Self-Adopt Sampling for Row Hammer Refresh Sampling" filed May 19, 2021, pp. all pages of application as filed.
U.S. Appl. No. 15/881,256 entitled 'Apparatuses and Methods for Detecting a Row Hammer Attack With a Bandpass Filter' filed Jan. 26, 2018, pp. all pages of application as filed.
U.S. Appl. No. 16/425,525 titled "Apparatuses and Methods for Tracking All Row Accesses" filed May 29, 2019, pp. all pages of application as filed.
U.S. Appl. No. 16/427,105 titled "Apparatuses and Methods for Priority Targeted Refresh Operations" filed May 30, 2019, pp. all pages of application as filed.
U.S. Appl. No. 16/427,140 titled "Apparatuses and Methods for Tracking Row Access Counts Between Multiple Register Stacks" filed May 30, 2019, pp. all pages of application as filed.
U.S. Appl. No. 16/437,811 titled "Apparatuses, Systems, and Methods for Determining Extremum Numerical Values" filed Jun. 11, 2019, pp. all pages of application as filed.
U.S. Appl. No. 16/537,981 titled "Apparatuses and Methods for Controlling Targeted Refresh Rates" filed Aug. 12, 2019, pp. all pages of application as filed.
U.S. Appl. No. 16/994,338 titled "Apparatuses, Systems, and Methods for Memory Directed Access Pause" filed Aug. 14, 2020, pp. all pages of application as filed.
U.S. Appl. No. 16/997,766 titled "Refresh Logic Circuit Layouts Thereof" filed Aug. 19, 2020, pp. all pages of application as filed.
U.S. Appl. No. 16/997,659 titled "Apparatuses, Systems, and Methods for Refresh Modes" filed Aug. 19, 2020, pp. all pages of application as filed.
U.S. Appl. No. 17/095,978 titled "Apparatuses and Methods for Controlling Refresh Timing" filed Nov. 12, 2020, pp. all pages of application as filed.
U.S. Appl. No. 17/127,654 titled "Apparatuses and Methods for Row Hammer Based Cache Lockdown" filed Dec. 18, 2020, pp. all pages of application as fifed.
U.S. Appl. No. 17/175,485 titled "Apparatuses and Methods for Distributed Targeted Refresh Operations" filed Feb. 12, 2021, pp. all pages of application as filed.
U.S. Appl. No. 15/789,897, entitled "Apparatus and Methods for Refreshing Memory", filed Oct. 20, 2017, pp. all pages of application as filed.
U.S. Appl. No. 15/796,340, entitled: "Apparatus and Methods for Refreshing Memory" filed Oct. 27, 2017, pp. all pages of application as filed.
U.S. Appl. No. 16/012,679, titled "Apparatuses and Methods for Multiple Row Hammer Refresh Address Sequences", filed Jun. 19, 2018, pp. all pages of application as filed.
U.S. Appl. No. 16/020,863, titled "Semiconductor Device", filed Jun. 27, 2018, pp. all pages of application as filed.
U.S. Appl. No. 16/112,471 titled "Apparatuses and Methods for Controlling Refresh Operations" filed Aug. 24, 2018, pp. all pages of application as filed.
U.S. Appl. No. 16/160,801, titled "Apparatuses and Methods for Selective Row Refreshes" filed Oct. 15, 2018, pp. all pages of application as filed.
U.S. Appl. No. 16/176,932, titled "Apparatuses and Methods for Access Based Refresh Timing", filed Oct. 31, 2018, pp. all pages of application as filed.
U.S. Appl. No. 16/208,217, titled "Semiconductor Device Performing Row Hammer Refresh Operation", filed Dec. 3, 2018, pp. all pages of application as filed.
U.S. Appl. No. 16/230,300, titled "Apparatuses and Methods for Staggered Timing of Targeted Refresh Operations" filed Dec. 21, 2018, pp. all pages of application as filed.
U.S. Appl. No. 16/231,327 titled "Apparatuses and Methods for Selective Row Refreshes", filed Dec. 21, 2018, pp. all pages of application as filed.
U.S. Appl. No. 16/237,291, titled "Apparatus and Methods for Refreshing Memory", filed Dec. 31, 2018, pp. all pages of application as filed.
U.S. Appl. No. 16/290,730, titled "Semiconductor Device Performing Row Hammer Refresh Operation", filed Mar. 1, 2019, pp. all pages of application as filed.
U.S. Appl. No. 16/374,623, titled "Semiconductor Device Performing Row Hammer Refresh Operation", filed Apr. 3, 2019, pp. all pages of application as filed.
U.S. Appl. No. 16/411,698 titled "Semiconductor Device" filed May 14, 2019, pp. all pages of application as filed.
U.S. Appl. No. 16/427,330 titled "Apparatuses and Methods for Storing Victim Row Data" filed May 30, 2019, pp. all pages of application as filed.
U.S. Appl. No. 16/431,641 titled "Apparatuses and Methods for Controlling Steal Rates" filed Jun. 4, 2019, pp. all pages of application as filed.
U.S. Appl. No. 16/682,606, titled "Apparatuses and Methods for Distributing Row Hammer Refresh Events Across a Memory Device", filed Nov. 13 2019, pp. all pages of application as filed.
U.S. Appl. No. 15/876,566 entitled 'Apparatuses and Methods for Calculating Row Hammer Refresh Addresses in a Semiconductor Device' filed Jan. 22, 2018, pp. all pages of application as filed.
U.S. Appl. No. 15/656,084, titled "Apparatuses and Methods for Targeted Refreshing of Memory", filed Jul. 21, 2017, pp. all pages of application as filed.
U.S. Appl. No. 17/226,975, titled "Apparatuses and Methods for Staggered Timing of Skipped Refresh Operations" filed Apr. 9, 2021, pp. all pages of application as filed.
U.S. Appl. No. 16/459,520 titled "Apparatuses and Methods for Monitoring Word Line Accesses", filed Jul. 1, 2019, pp. all pages of application as filed.
PCT Application No. PCT/US18/55821 "Apparatus and Methods for Refreshing Memory" filed Oct. 15, 2018, pp. all pages of application as filed.
U.S. Appl. No. 15/715,846, entitled "Semiconductor Device", filed Sep. 26, 2017, pp. all pages of application as filed.
U.S. Appl. No. 15/888,993, entitled "Apparatuses and Methods for Controlling Refresh Operations", filed Feb. 5, 2018, pp. all pages of application as filed.

(56) References Cited

OTHER PUBLICATIONS

U.S. Appl. No. 16/190,627 titled "Apparatuses and Methods for Targeted Refreshing of Memory" filed Nov. 14, 2018, pp. all pages of application as filed.
U.S. Appl. No. 17/030,018, titled "Apparatuses and Methods for Controlling Refresh Operations", filed Sep. 23, 2020, pp. all pages of application as filed.
U.S. Appl. No. 15/281,818, entitled: "Semiconductor Device" filed Sep. 30, 2016, pp. all pages of application as filed.
Kim, et al., "Flipping Bits in MemoryWithout Accessing Them: An Experimental Study of DRAM Disturbance Errors", IEEE, Jun. 2014, 12 pgs.

* cited by examiner

APPARATUSES AND METHODS FOR DYNAMIC TARGETED REFRESH STEALS

CROSS REFERENCE TO RELATED APPLICATION(S)

This application is a continuation of U.S. patent application Ser. No. 16/655,110 filed Oct. 16, 2019 and issued as U.S. Pat. No. 11,302,377 on Apr. 12, 2022. The aforementioned application, and issued patent, is incorporated herein by reference, in its entirety, for all purposes.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored m the memory cells). It may be necessary to periodically refresh the information in the memory cells by, for example, rewriting the information to restore the physical signal to an initial value.

As memory components have decreased in size, the density of memory cells, has greatly increased. Repeated access to a particular memory cell or group of memory cells (often referred to as a 'row hammer') may cause an increased rate of data degradation in nearby memory cells. Memory cells affected by the row hammer effect may be identified and refreshed as part of a targeted refresh operation. These targeted refresh operations may take the place of (e.g., steal) time slots which would otherwise be used for a background refresh operation. It may be desirable to balance the number of background refresh operations and targeted refresh operations.

DETAILED DESCRIPTION

Figure 1:
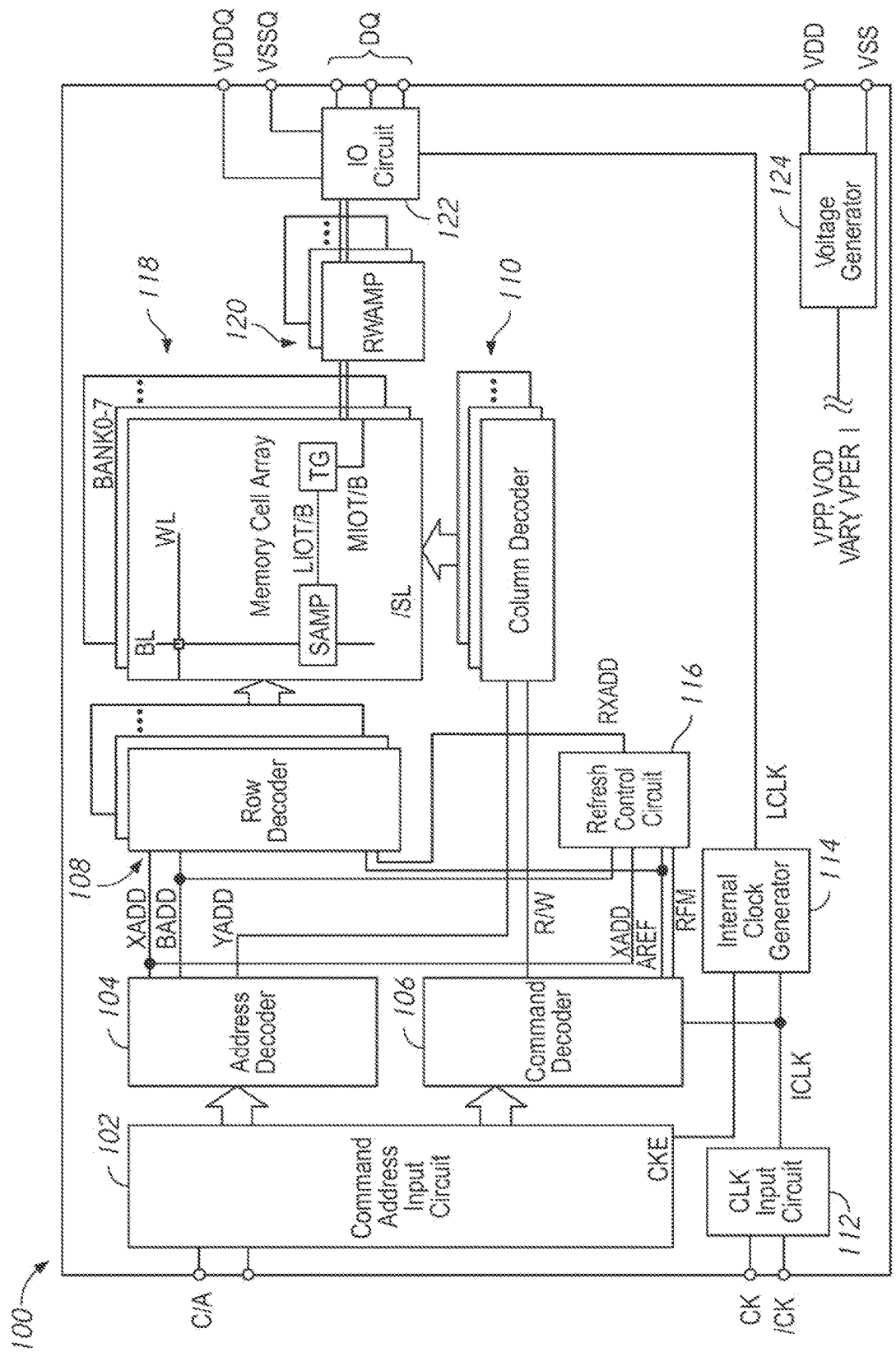
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), and the memory cells may be refreshed on a row-by-row basis. In order to prevent information from being lost or corrupted due to this decay, the memory may carry out a background refresh process, such as refresh operations as part of a refresh mode. During a to operation, information may be rewritten to the wordline to restore its initial state. Auto-refresh operations may be performed on the wordlines of the memory in a sequence such that over time each of the wordlines of the memory are refreshed at a rate faster than the expected rate of data degradation.

Repeated access to a particular row of memory (e.g., an aggressor row) may cause an increased rate of decay in rows (e.g., victim rows) which are close to the aggressor row. These repeated accesses may be part of a deliberate attack against the memory and/or may be due to 'natural' access patterns of the memory. The increased rate of decay in the victim rows may require that they be refreshed as part of a targeted refresh operation. The memory device may periodically perform targeted refresh operations as part of the refresh mode. For example, when the memory device is in a refresh mode it may perform a set of refresh operations including a number of auto-refresh operations, and a number of targeted refresh operations and then repeat this cycle. In some embodiments, the targeted refresh operations may 'steal' timeslots which would otherwise be used for auto-refresh operations. A memory device may generally cycle between performing access operations for a period of time, entering a refresh mode for a period of time, performing access operations and so forth.

If a memory begins receiving access requests at a very high rate, it may indicate that an attack against the memory is occurring and it may be desirable to perform targeted refresh operations even when the device is not in a refresh mode. Based on rate of access commands (e.g., on a bank-by-bank basis), a targeted refresh request command (e.g., a refresh management signal) may be issued which may lead to additional targeted refresh operations being performed while the memory is not in the refresh mode (e.g., in addition to the periodic targeted refresh operations). However, as the number of targeted refresh operations between refresh modes increases, it may be less necessary to perform targeted refresh operations within the next refresh mode. It may be desirable to manage targeted refresh operations so that as the number of requested targeted refresh operations increases, less periodic targeted refresh operations are performed during, the next refresh mode.

The present disclosure is drawn to apparatuses, systems, and methods for dynamic targeted refresh steals. A memory controller may count a number of access commands which are being issued to particular bank of the memory. Once the count of access commands meets or exceeds a threshold, the controller may send a refresh management signal and decrease the count. Accordingly, the memory device may receive access commands along with refresh management commands. Responsive to the refresh management signal, the memory may perform a targeted refresh operation, even if the memory is not otherwise performing refresh operations (e.g., is not currently in a refresh mode). The memory device may count a number of times a refresh management signal is issued, and may decrease a number of periodic targeted refresh operations during a next refresh mode as the count of refresh management signals increases. For example, when the count of refresh management signals meets or exceeds a threshold, a next periodic targeted refresh operation may be skipped and the count may be decreased.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks, in the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external docks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output, circuit 122 to time operation of circuits included in the input/output circuit 122, for example, to data receivers to time the receipt of write data.

The C/A terminals may be supplied with memory addresses. The memory addresses supplied to the C/A terminals are transferred, via a command address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106 which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the refresh mode. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent, a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD, the row decoder 108 may perform a targeted refresh or auto-refresh operation. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

As used herein, an activation of a signal may refer to any portion of a signal's waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing, data degradation in nearby victims. For example, the refresh control circuit 116 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

The refresh control circuit 116 may use multiple methods to determine the timing of targeted refresh operations. The refresh control circuit 116 may have periodic targeted refresh operations during a refresh mode, where the refresh control circuit 116 performs auto-refresh operations and targeted refresh operations (e.g., by providing a targeted refresh address as the refresh, address RXADD) based on a periodic schedule. For example, after entering a refresh mode, the refresh control circuit 116 may perform a certain number of auto-refresh operations, and then perform e.g., steal) a certain number of targeted refresh operations.

The refresh control circuit 116 may also perform requested targeted refresh operations or panic targeted refresh operations, which may be based on access patterns to the bank associated with the refresh control circuit 116. The device 100 may receive commands which are refresh management commands (e.g., may receive request management commands at the command/address terminal C/A). The command decoder circuit 106 may provide a refresh management signal RFM based on the refresh management command. In some embodiments, the refresh management command may be the signal RFM, which may be passed directly to the refresh control circuit 116. Responsive to an activation of the RFM signal, the refresh control circuit 116 may indicate that a panic targeted refresh operation should be performed.

These panic targeted refresh operations may happen outside of a refresh period. For example, a high rate of accesses to the bank may indicate that an attack is taking place, and the refresh control circuit 116 may count the access commands and perform a panic targeted refresh operation once the count exceeds a threshold. As the number of panic targeted refresh operations increases, the refresh control circuit 116 may decrease a number of periodic targeted refresh operations during the next refresh mode. It should be understood that the process of refreshing wordlines during a periodic and panic targeted refresh operation may generally be the same, and the difference may generally be in the timing of when the refreshes are performed.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
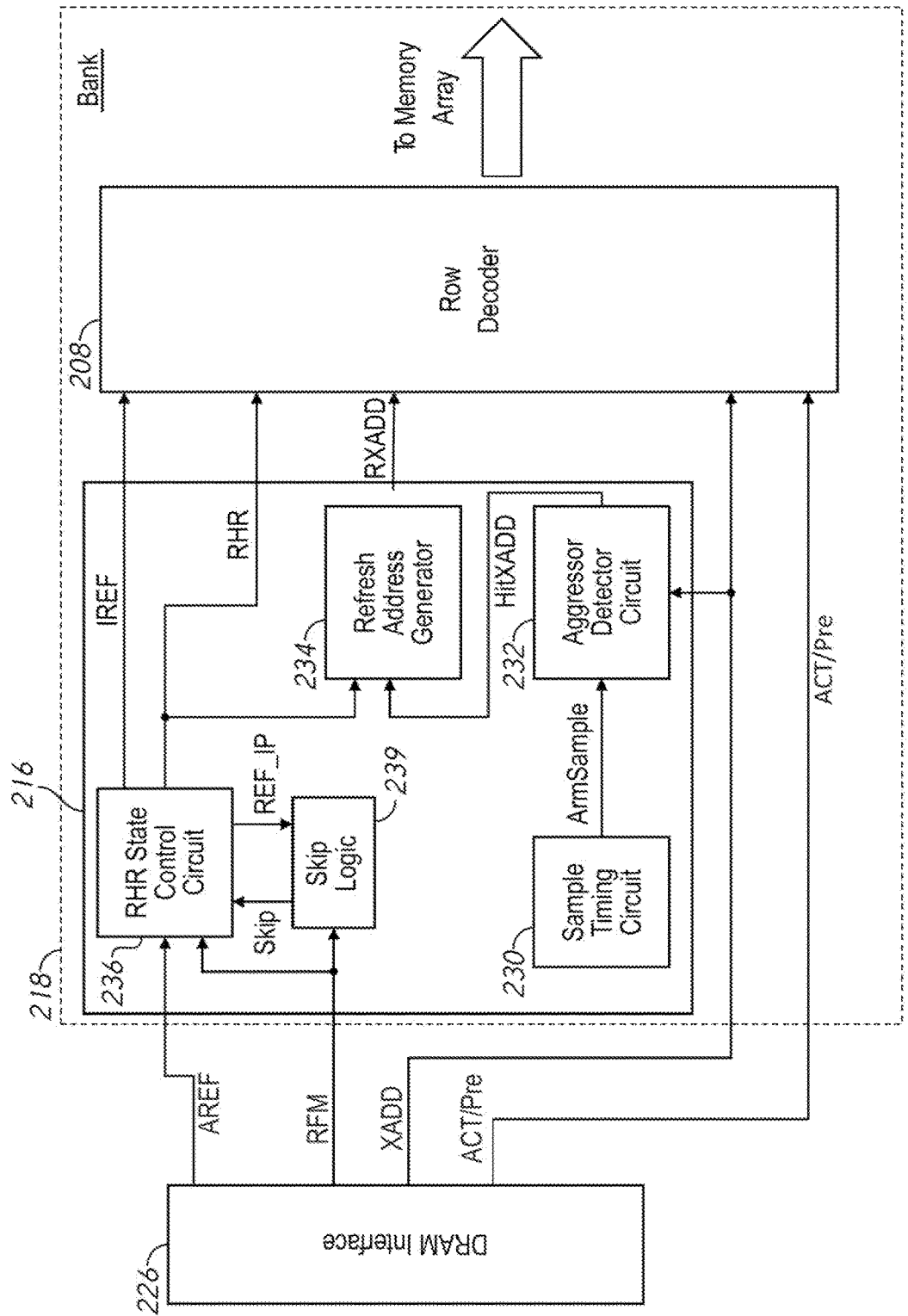
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and roar decoder 208 the refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, activation and pre-charge signals ACT/Pre, and a row address XADD. The refresh control circuit 216 provides refresh address RXADD with timing based on the refresh signal AREF when the bank associated with the refresh control circuit 216 is in the refresh mode. The refresh control circuit may also provide the refresh address RXADD (and other signals) to indicate a panic targeted refresh based on a pattern of accesses to the bank of the memory.

In the example embodiment of FIG. 2, the aggressor detector circuit 232 may sample the current row address XADD responsive to an activation of an optional sampling signal ArmSample provided by the sample timing circuit 230. The aggressor detector circuit 232 may be coupled to all of the row addresses XADD sent along the row address bus, but may only receive (e.g., process, pay attention to) the current value of the row address XADD when there is an activation of the sampling signal ArmSample. In other example embodiments sampling may not be used.

The received row addresses (either the sampled addresses or all addresses) may be stored in the aggressor circuit 232 and/or compared to previously stored addresses. The aggressor detector circuit 232 may provide a match address HitXADD based on a current row address XADD and/or previously stored row addresses. The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto-refresh should occur.

Responsive to an activation of RHR or IREF, the refresh address generator 234 may provide a refresh address RXADD, which may be an auto-refresh address or may be one or more victim addresses corresponding to victim rows of the aggressor row corresponding to the match address HitXADD. The RHR state control circuit 236 may provide a set of activations of RHR and IREF responsive to the refresh signal AREF. The row decoder 208 may perform a refresh operation responsive to the refresh address RXADD and the row hammer refresh signal RHR. The row decoder 208 may perform an auto-refresh operation based on the refresh address RXADD and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal Pre. Although not shown in FIG. 2, the DRAM interface 226 may also provide a bank address BADD, which may indicate which bank the accessed row address XADD is located in. The bank address BADD may activate a particular refresh control circuit 216 associated with the bank indicated by the bank address BADD. The DRAM interface may also put the refresh control circuit into a refresh mode by providing activations of the refresh signal AREF. The refresh signal AREF may be a periodic signal provided during a refresh mode which may indicate a timing for refresh operations.

The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

In the example embodiment of FIG. 2, the refresh control circuit 216 uses sampling to monitor a portion of the row addresses XADD provided along the row address bus. Accordingly, instead of responding to every row address, the refresh control circuit 216 may sample the current value of the row address XADD on the row address bus, and may determine which addresses are aggressors based on the sampled row addresses. The timing of sampling by the refresh control circuit 216 may be controlled by the sample timing circuit 230 which provides the sampling signal ArmSample. The sample inning circuit 230 may provide activations of the sampling signal ArmSample, and each activation of the signal ArmSample may indicate that a current value of the row address should be sampled. An activation of ArmSample may be a 'pulse', where. ArmSample is raised to a high logic level and then returns to a low logic level. The activations of the signal ArmSample may be provided with periodic timing, random timing, semi-random timing, pseudo-random timing, or combinations thereof hi some embodiments, the timing of the signal ArmSample may be based, in part, on one or more other signals, such as access signals ACT/Pre. In other embodiments, sampling may not be used, and the aggressor detector circuit 232 may receive every value of the row address XADD along the row address bus. In such embodiments, the sample timing circuit 230 and the sampling signal ArmSample may be omitted.

The aggressor detector circuit 232 may receive the row address XADD from the DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD.

The aggressor detector circuit 232 may determine aggressor addresses based on one or more of the sampled row addresses, and then may provide the determined aggressor address as the match address HitXADD. The aggressor detector circuit 232 may include a data storage unit (e.g., a number of registers), which may be used to store sampled row addresses. In some example embodiments, when the aggressor detector circuit 232 samples a new value of the row address XADD (e.g., responsive to an activation of ArmSample) it may compare the sampled row address to the addresses stored in the data storage unit. If there is a match between the sampled address and one of the stored addresses, the aggressor detector circuit 232 may provide a match signal Match. In some example embodiments, the match address HitXADD may be one of the addresses stored in the aggressor detector circuit 232 which has been matched by the sampled address XADD the most frequently. For example, the aggressor detector circuit 232 may count a number of times that each address XADD is received, and provide the address which has been received the most times as the match address HitXADD.

The memory device may carry out a sequence of refresh operations in order to periodically refresh the rows of the memory device as part of a refresh mode. The RHR state control circuit 236 may determine if a given refresh operation is an auto-refresh operation or a targeted refresh operation. The RHR signal may be generated in order to indicate that the device should refresh a particular targeted row (e.g., a victim row) instead of an address from the sequence of auto-refresh addresses. The RHR state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time). In some embodiments IREF may be activated for every refresh operation, and an auto-refresh operation may be performed unless RHR is also active, in which case a targeted refresh operation is performed instead. The RHR state control circuit may perform a sequence of auto-refresh operations and targeted refresh operation responsive to one or more activations of the refresh signal AREF.

In some embodiments, the refresh control circuit 216 may perform multiple refresh operations responsive to each activation of the refresh signal AREF. For example, each time the refresh signal AREF is received, the refresh control circuit 216 may perform K different refresh operations, by providing K different refresh addresses RXADD. Each refresh operation may be referred to as a 'pump'. Each of the K different refresh operations may be an auto-refresh operation or a targeted refresh operation. In some embodiments, the number of targeted and auto-refresh operations may be constant in each group of pumps responsive to an activation of the refresh signal REF. In some embodiments it may vary.

The refresh address generator 234 may receive the row hammer refresh signal RHR and the match address HitXADD. The match address HitXADD may represent an aggressor row. The refresh address generator 234 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The refresh address generator 234 may determine the value of the refresh address RXADD based on the row hammer refresh signal RHR. In some embodiments, when the signal RHR is not active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows, (e.g., HitXADD+−1) more frequently than victim rows which are further away from the aggressor address (e.g., HitXADD+/−2).

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

The refresh control circuit 216 receives a refresh management signal RPM, which may be provided to a memory device (e.g., device 100 of FIG. 1) based on access operations performed on the bank associated with the refresh control circuit 216. Responsive to the signal RFM, the RHR state control circuit 236 may perform a targeted refresh operation even if the device is not otherwise performing refresh operations.

Accordingly, the RHR state control circuit 236 may indicate that targeted refresh operations should be performed as pan of a periodic sequence, and may also indicate that targeted refresh operations should be performed responsive to an activation of the signal RFM. Targeted refresh operations performed as part of a periodic sequence of refresh operations may generally be referred to as 'periodic targeted refresh operations' in order to distinguish them from targeted refresh operations performed responsive to the signal RFM, which may generally be referred to as 'requested targeted refresh operations' or 'panic targeted refresh operations'. It should be understood that the method of actually performing the periodic targeted refresh operation and the requested targeted refresh operation may generally be the same (e.g., refreshing victim wordlines based on the match address HitXADD), and the different terminology is meant to distinguish the cause of a particular targeted refresh operation.

A memory controller may monitor the access commands which are being provided to a given bank of the memory. The memory controller may include a refresh management (RFM) logic circuit which may include a count value. The count value stored in the RFM logic circuit may be a rolling accumulated ACT (RAA) count. The controller may include a separate count value RAA for each bank of the memory device and may separately compare each count value RAA to a threshold to determine if the signal RFM (or a refresh management command) should be provided to the bank associated with that count value RAA. The RAA count may be compared to a threshold which is an RAA initial management threshold (RAAIMT). The value of the threshold RAAIMT may be a configurable value.

The signal RFM may be provided to the memory device based on the comparison of the count RAA to the threshold RAAIMT. For example, in an embodiment where the count RAA is increased responsive to each activation of ACT, the controller may determine if the count RAA is greater than the threshold RAAIMT. In such an embodiment, if the count RAA is greater than RFM then the signal RFM is provided to the refresh control circuit 216. When the signal RFM is provided, the value of the count. RAA may be changed. For example, if the count RAA is increased (e.g., incremented) responsive to ACT, then responsive to the signal RFM being provided, the count RAA may be decreased. In some embodiments, the count RAA may be decreased by the value of the threshold RAAINT, in some embodiments, the count value RAA may have a minimum value (e.g., 0) which the count value RAA cannot be decreased below even if the reduction of RAA by the value of RAAINT would normally be below that minimum value.

The RHR state control circuit 236 may receive, the refresh signal AREF and the signal RFM and provide the row hammer refresh signal RHR and internal refresh signal REF. The refresh signal AREF may be periodically generated and may be used to control the timing of refresh operations. The signals RHR and IREF may be used to control whether the memory performs a targeted refresh operation or an auto-refresh operation, respectively. For example, responsive to each activation of the signal AREF, the RHR state control circuit 236 may provide a number of activations of the internal refresh signal IREF. Responsive to each activation of IREF (as long as the signal RHR is not active) an auto-refresh operation may be performed. The RHR state control circuit 236 may perform periodic targeted refresh operations by providing a number of activations of the signal REM after counting a certain number of the activations of IREF. In other words, with timing based on AREF, the RHR state control circuit 236 may indicate that the memory should provide a first number of auto-refresh operations, then a second number of auto-refresh operations, then the first number of auto-refresh operations again, etc. For example, the RHR state control circuit 236 may indicate that 8 auto-refresh operations should be performed (e.g., by providing IREF eight times) and then may indicate that 4 targeted refresh operations should be performed (e.g., by providing IREF along with RHR four times), and then repeating that cycle for as long as the memory device is in a refresh mode. Other numbers of auto-refresh and targeted refresh operations may be used in other examples. Accordingly, a normal operation of the memory may include a period of time over which the memory performs some number of access operations (e.g., due to external commands) and then a period of time in a refresh mode (e.g., when AREF is being provided) where a sequence of auto- and targeted-refresh operations are being performed.

Responsive to receiving the signal RFM, the RHR state control circuit 236 may indicate that one or more panic targeted refresh operations should be performed. In some embodiments, after receiving the signal RFM, the RHR state control circuit 236 may perform a panic targeted refresh operation even if as refresh operation would not otherwise be performed. For example, after receiving the signal RFM, even if the memory device is not currently in a refresh mode, the refresh control circuit 216 may issue the signals IREF and RHR together to indicate that a targeted refresh operation should be performed. In some embodiments, access operations may be put 'on hold' while the memory performs a panic targeted refresh and access operations may then resume. In some embodiments, the RHR state control may indicate that multiple targeted refresh operations should be performed (e.g., by providing the signals RHR and IREF multiple times). For example, responsive to each activation of the signal RFM, the RHR state control circuit 236 may indicate that two panic targeted refresh operations should be performed. Other numbers of panic targeted refresh operations may be performed responsive to each activation of RFM in other examples.

The refresh control circuit 216 may include a skip logic circuit 239, which, may receive the signals RFM and REF_IP and provide the signal Skip based on those two signals. The signal Skip may be used to indicate that the RHR state control circuit 236 should skip the next periodic targeted refresh operation (e.g., because enough targeted refreshes have already been performed by panic targeted refreshes before the current refresh mode). In some embodiments the signal Skip may cause the RHR state control circuit 236 to skip all of the periodic targeted refresh operations in a next refresh period (e.g., the next period of time where there is a refresh mode). In some embodiments, where the memory performs multiple targeted refresh operations periodically as part of each refresh period, the signal Skip may cause the RHR state control circuit 236 to skip only a portion of the periodic targeted refresh operations.

For example, only one periodic targeted refresh operation may be skipped due to the activation of the signal Skip. Other numbers of periodic targeted refresh operations may be skipped in other example embodiments.

When the RHR state control circuit 236 receives the signal Skip, it may skip (e.g., not perform) a next periodic targeted refresh operation. In some embodiments, the RHR state control circuit 236 may skip a periodic targeted refresh operation by not performing any kind of refresh operation. In some embodiments, the RHR state control circuit 236 may skip a periodic targeted refresh operation by performing an auto-refresh operation instead (e.g., by providing the signal IREF alone). When a periodic targeted refresh operation is skipped, the RHR state control circuit 236 may provide an activation of a signal REF_IP which indicates that a periodic targeted refresh operation was skipped. The activation of REF_IP may be a pulse of the signal, where the signal is changed from an inactive level to an active level for a period of time, and then returned to the inactive level.

The skip logic circuit 239 may provide the signal Skip based on a count of the number of panic targeted refresh operations. The skip logic circuit 239 may count a number of activations of the signal RFM and compare that count to a threshold. For example, each time the signal RFM is activated, a count value N in the skip logic circuit 239 may be increased (e.g., incremented by one). Each time the count value N is changed, it may be compared to a threshold N_th. When the count value N meets or exceeds the threshold N_th, the signal Skip may be provided. The signal Skip may continue to be provided at an active level until the RHR state control circuit 236 responds to the signal Skip (e.g., by skipping a next periodic targeted refresh operation). Responsive to the RHR state control circuit 236 skipping a periodic targeted refresh operation (e.g., when the RHR state control circuit 236 provides the signal REF_IP), the skip logic circuit 239 may change the count N in a different direction than the value N is changed responsive to the signal RFM. For example, responsive to a periodic targeted refresh operation being skipped (e.g., responsive to the signal REF_IP), the count value N may be decreased. In some embodiments, the count value N may be decreased by the value of the threshold N_th. In some embodiments, the count value N may be reset to an initial value (e.g., 0).

The value of the threshold N_th may be based on a number of targeted refresh operations performed as part of each periodic targeted refresh cycle and a number of targeted refresh operations performed responsive to each activation of the signal RFM. For example, the value of the threshold N_th may be set as multiple of the ratio of the number of targeted refresh operations performed per periodic targeted refresh cycle (I) to the number of targeted refresh operations performed responsive to each activation of the signal RFM (J). In one example embodiment, the value of N_th may be given by N_th=2*I/J. The value of N_th may be programmable, for example it may be set by a trim fuse of the memory.

In some embodiments, the skip logic 239 may separately control skip operations for targeted refresh operations on different types of victim word lines. For example, the skip logic 239 may include a first threshold N_th1 and when the count N is above the threshold N_th1, the skip logic circuit 239 may provide a signal which causes a next periodic targeted refresh operation on +/−1 (e.g., adjacent) victim word lines to be skipped. The skip logic 239 may also include a second threshold N_th2 and when the count N is above the second threshold N_th2, the skip logic circuit 239 may provide a signal which causes a next periodic targeted refresh operation on a +/−2 victim word lines to be skipped.

Figure 3A:
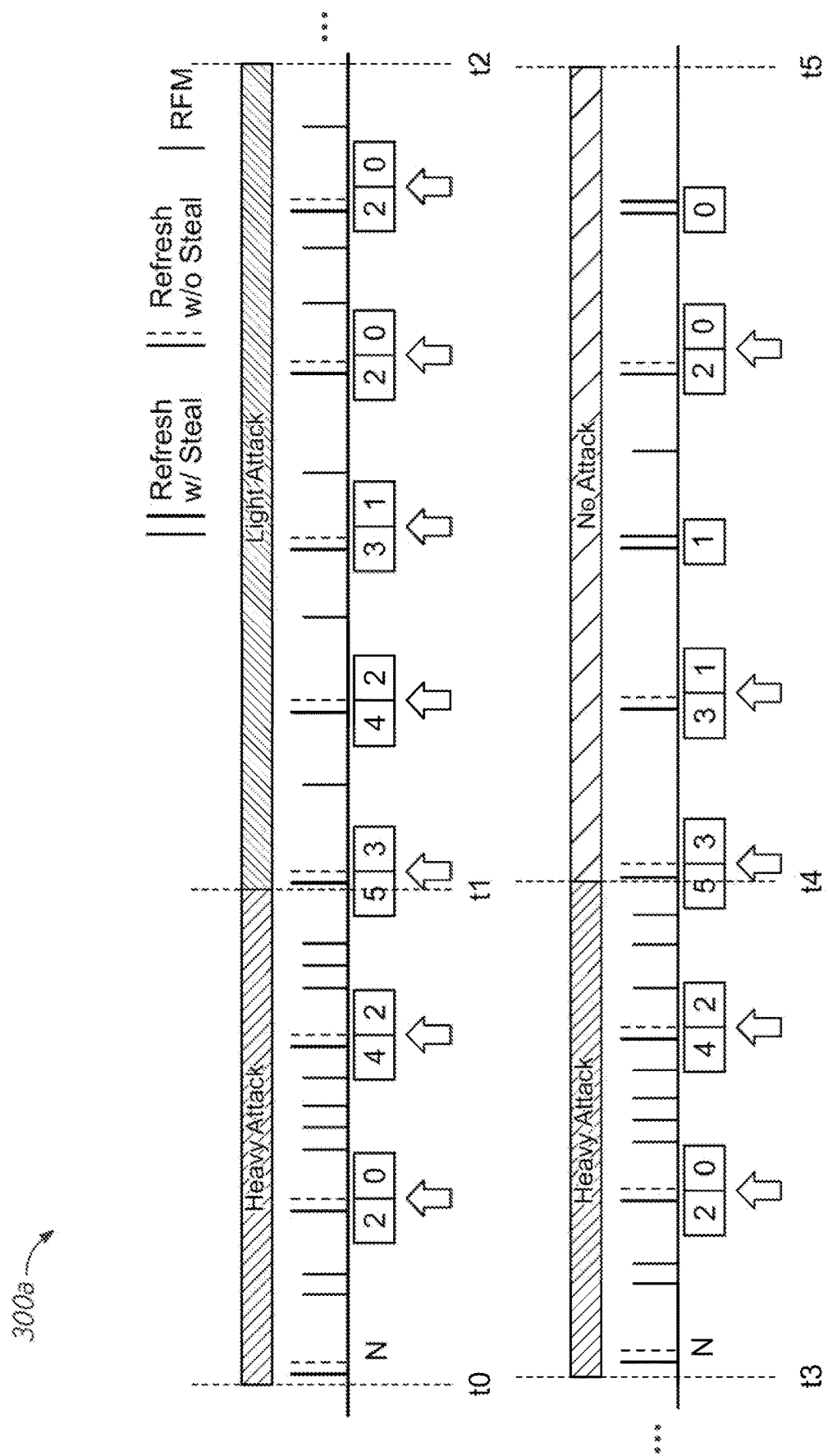
FIGS. 3A-3B are timing diagrams of an operation of a refresh control circuit according to an embodiment of the present disclosure.
Figure 3B:
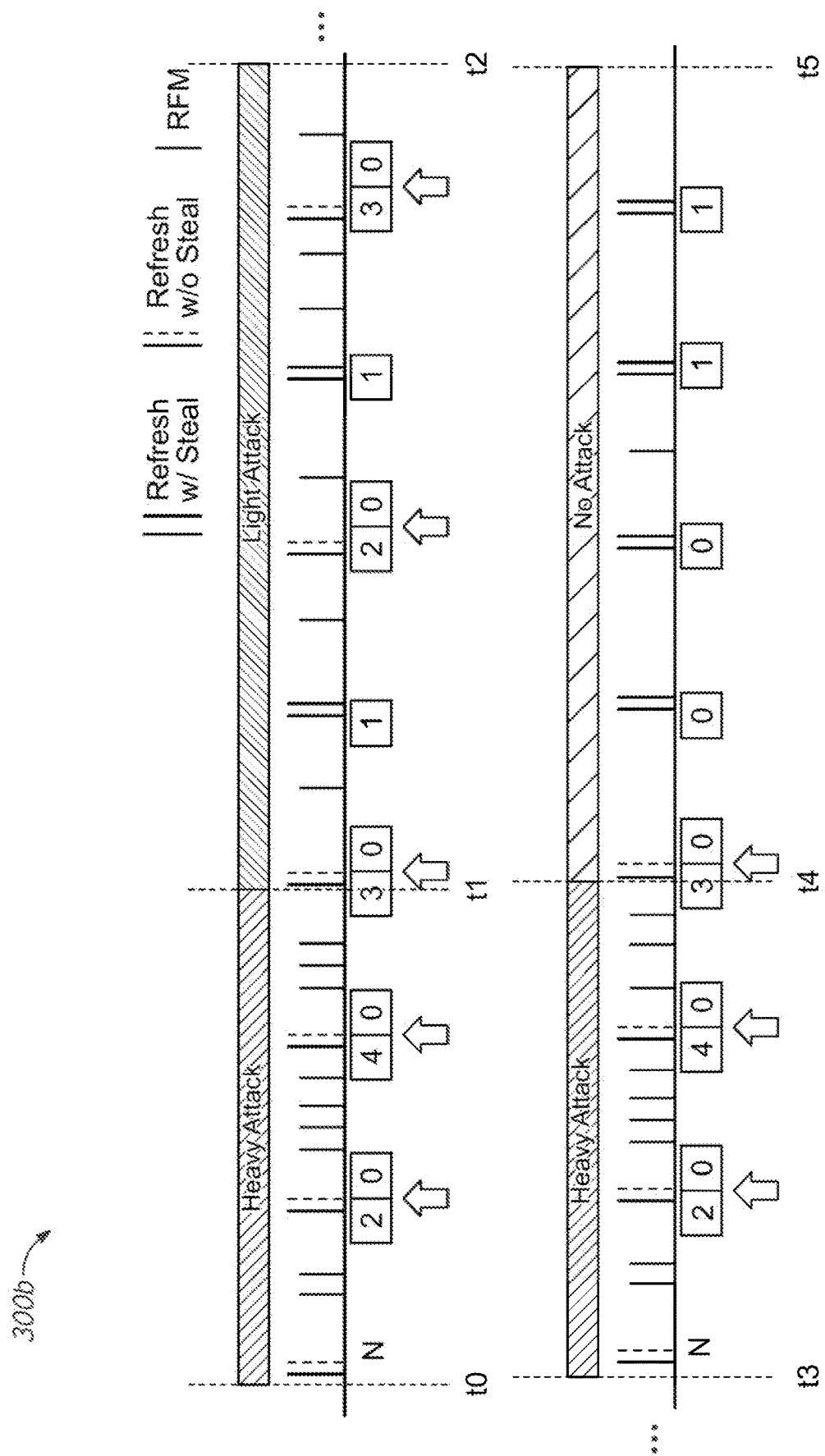

FIGS. 3A-3B are timing diagrams of an operation of a refresh control circuit according to an embodiment of the present disclosure. The timing diagrams 300a and 300b show the operation of refresh control circuit (e.g., 116 of FIG. 1 and/or 216 of FIG. 2) which counts refresh management signals RFM in order to determine when to skip a next periodic targeted refresh operation. FIGS. 3A-3B show different embodiments of the operation of a skip logic circuit (e.g., 239 of FIG. 2). In particular FIG. 3A shows an embodiment where after a periodic targeted refresh operation is skipped, the count value N is decreased by the threshold value N_th (which in the example of FIG. 3A is 2). For example, each time the signal REF_IP is provided, the count value N may be decreased by N_th. FIG. 3B shows an embodiment where after a periodic targeted refresh operation is skipped, the count value N is reset to an initial value (in this case, 0). For example each time the signal REF_IP is provided, the value N may be reset to 0.

FIGS. 3A and 3B both show the same pattern of accesses to a memory bank. A first line of the timing diagrams 300a-b shows the relative rate at which the memory bank is being accessed. Time may be represented along t in x axis, starting from an initial time t0. A period of time labelled as a 'heavy attack' (e.g., t0 to t1, and t3 to t4) represents a period over which the memory bank is receiving a very high rate of access commands, which may signify that it is undergoing a malicious attack such as a row hammer attack. A period of time labelled as a 'light attack' (e.g., t1 to t2) represents a period over which the memory bank is receiving a high rate of access commands, which may be part of a malicious attack, however the rate of accesses during the light attack is less than the rate during the heavy attack. A period of time labelled 'no attack' t4 to t5) indicates that the memory is receiving a normal rate of access commands.

The second line of the timing charts 300a-b shows the refresh operations performed by the memory along with the refresh management signal RFM as well as the accesses between the refresh operations. For purposes of clarity, the timing diagrams of FIGS. 3A-3B show a simplified periodic refresh pattern where each refresh mode includes a single auto-refresh operation and the opportunity for a single targeted refresh operation. It should be understood that other numbers of refresh operations can be used in other example embodiments.

The third line of the timing charts 300a-b shows the count value N in the skip logic circuit (e.g., 239 of FIG. 2). To highlight the behavior of how the count value N is changed when a periodic targeted refresh operation is skipped, the count value is only shown each time the memory performs the periodic auto and targeted refresh operations. Each time the count value N is shown, it is shown as a pair of values, the value of the count N just before the periodic refresh operations are performed and right after, the periodic refresh operations are shown. An arrow is shown pointing at the numbers to indicate times where the periodic targeted refresh operations are skipped.

At the initial time t0, the count value (not shown may be at 0 after the periodic targeted refresh operation just after t0 is skipped. In the case of both the embodiments shown in FIGS. 3A and 3B, the threshold N_th is set to a value of two. After the time t2, there is a gap where memory operations are not shown before the time t3. Starting at t3, similar to the initial time t0, the count value is 0 after a targeted refresh operation just after t3 has been skipped.

FIG. 3A shows a timing diagram 300a for an embodiment where each time a periodic targeted refresh operation is skipped, the count value N is decreased by the value of the threshold N_th, which in this example embodiment is 2. After t0, the signal RFM is issued two times, and then there is a periodic refresh operation. At that periodic refresh operation, the targeted refresh operation is skipped and the count N is reduced to 0. Then there are four more RFM signals and the count is increased to 4. When the next periodic targeted refresh operation is skipped, the count N is dropped to 2. There are then three more RFM signals which raise the count N to 5. After the next periodic targeted refresh operation (e.g., because N=5>=N_th=2) the count is reduced to 3.

In the embodiment of FIG. 3A, per targeted refresh operations may continue to be skipped even when RFM signals are not being issued. Jumping ahead to the time t4, when a period of no attacks begins, the count value N stands at 4 after a periodic targeted refresh operation is skipped. The signal RFM is not provided and so the count N stays at a value of 4 when the next periodic refresh operations begin. Since the value of the count N still meets or exceeds the value of the threshold N_th, the periodic targeted refresh operation is skipped. Accordingly, in the embodiment of FIG. 3A, periodic targeted refresh operations may still be skipped even when the access rate to the memory is low enough that the signal RFM is not being provided.

FIG. 3B shins an embodiment here the count value N is reset to a minimum value (e.g., 0) each time a periodic targeted refresh operation is skipped. Starting at the initial time t0, as may be seen after two activations of the signal RBI, the count value N is 2. After a periodic targeted refresh operation is skipped, the count value N is reset to 0. There are then four activations of the signal RFM, and so the count value is N. After a next periodic targeted refresh operation is skipped, the count value N is reset again to 0. Resetting the value of N may help to ensure that periodic targeted refresh operations are only skipped when the signal RFM is provided between periods of refresh operation (e.g., when the memory bank is receiving access commands at a high rate). As may be seen, in contrast to the embodiment of FIG. 3A, in the embodiment of FIG. 3B, no targeted refresh operations are skipped after the period with no attacks begins at the time t4.

Figure 4:
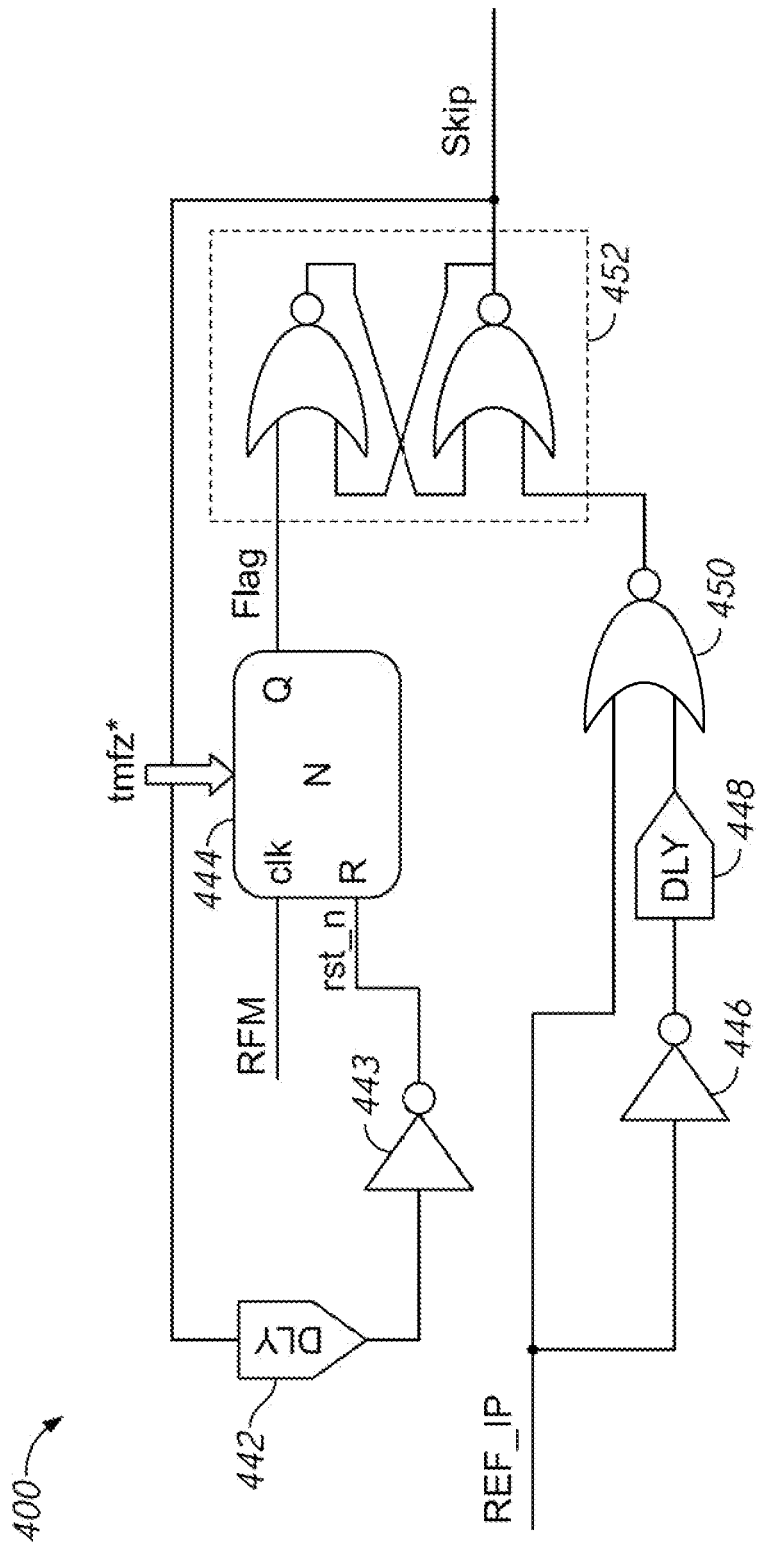
FIG. 4 is a schematic diagram of a skip logic circuit according to an embodiment of the present disclosure.

FIG. 4 is a schematic diagram of a skip logic circuit according to an embodiment of the present disclosure. The skip logic circuit 400 may, in some embodiments, be included in the skip logic circuit 239 of FIG. 2. The example skip logic circuit 400 may exhibit the behaviors shown in the tuning diagram 300b of FIG. 3B, and may reset a count value N each time a periodic refresh operation is skipped.

The skip logic circuit 400 includes a counter circuit 444 which stores and manages the value of the count N. In the embodiment of FIG. 4, the counter circuit 444 also manages the comparison of the count N to the threshold N_th, which is set based on a signal tmfz from a trim fuse (e.g., as set in a fuse array of the memory device). In other embodiments a separate comparator circuit may be used. When the count value N meets or exceeds the threshold N_th, the counter circuit 444 provides the signal Flag at an active level (e.g., a high logical level). The signal Flag may continue to be provided at an active level until the count value N is below the threshold N_th (e.g., until after the count value is reset).

A clk terminal of the counter circuit 444 is coupled to the refresh management signal RFM. Each time an activation of the signal RFM is received (e.g., a rising edge of RFM), the counter circuit 444 may increment the value of N. The counter circuit 444 may compare the count value N to the threshold N_th each time the count value is changed. A reset terminal of the counter circuit is coupled to a reset signal rst_n. When the counter circuit 444 receives an activation of the signal rst_n (e.g., the signal rst_n at a low logical level), the count value N may be rest to an initial value (e.g., 0). In some embodiments, the threshold may be set by setting a maximum value that the count value N may have, and then setting the signal Flag to an active level when the count exceeds the maximum value rolls over). Accordingly, the signal tmfz may be used to set a maximum value of N to N_th−1.

The reset signal rst_n may be based on the state of the signal Skip. The signal Skip may be coupled through a delay circuit 442 to an inverter circuit 443. Accordingly, at a first time, the signal skip may rise front a low logical level to a high logical level (e.g., when the count value N meets or exceeds the threshold N_th). At a second time which is after the first time, the signal rst_n may change from a high logical level to a low logical level. This in turn may cause the count value to reset, and the signal Flag to drop to a low logical level.

The skip logic circuit 400 includes a latch circuit 452, which may store and provide a value of the skip signal Skip. The latch circuit 452 may be used to ensure that the signal Skip remains at an active level (e.g., a high logical level) until after a next periodic targeted refresh operation is skipped. As shown in the circuit of the example of FIG. 4, the latch circuit 452 may include a cross coupled pair of NOR gates. A first NOR gate has a first input terminal coupled to the signal Flag, and a second input terminal coupled to the signal Skip. The first NOR gate has an input terminal coupled to a first input terminal of the second NOR gate, which has a second input terminal coupled to a falling, edge detector of the signal REF_IP (as described herein). The output of the second NOR gate is the signal Skip. The latch circuit 452 has a data terminal coupled to the signal Flag. When the signal Flag is received at an active level, the signal Skip saved in the latch circuit 452 is set to an active level. The latch circuit 452 has a reset terminal which is coupled to the output of a NOR gate 450 (which provides a signal at a high logical level responsive to a falling edge of the signal REF_IP). When the signal on the reset terminal is received at a high logical level, the signal Skip is changed to a low logical level.

The skip logic circuit 400 receives the signal REF_IP, which indicates that a periodic targeted refresh operation has been skipped. The signal REF_IP is coupled to the reset terminal of the latch circuit 452 through an inverter 446, a delay circuit 448, and a NOR gate 450 which act as a falling edge detector for the signal REF_IP. One of the input terminals of the NOR gate 450 is coupled to the signal REF_IP. The other input terminal of the NOR gate 450 is coupled to the signal REF_IP through the inverter circuit 446 and the delay circuit 448. Accordingly, when the signal REF_IP falls from an active level to an inactive level (e.g., a high logical level to a low logical level), the NOR gate 450 may provide a signal at a high logical level, which may reset the latch circuit 452 so that the signal Skip is provided at a low logical level.

Figure 5:
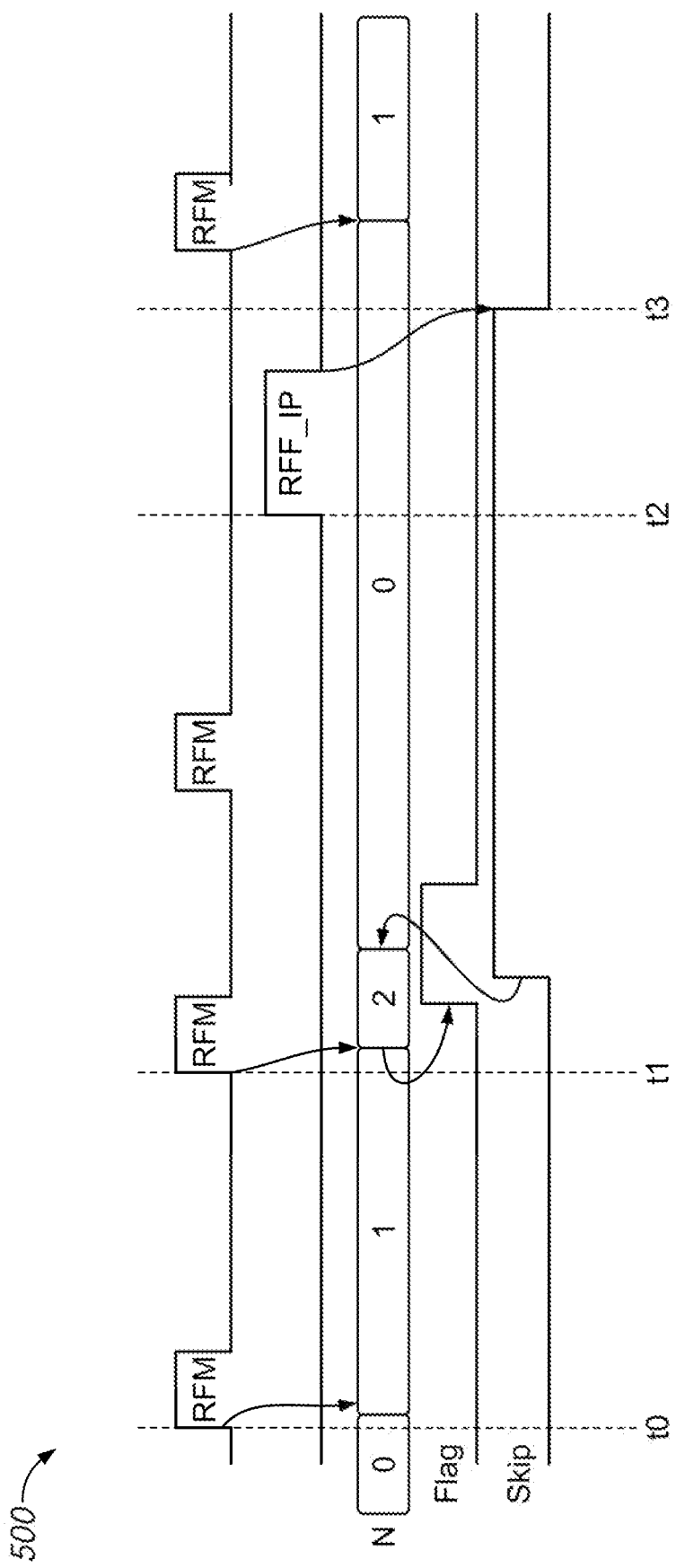
FIG. 5 is a timing diagram of a signals of a skip logic circuit according to an embodiment of the present disclosure.

FIG. 5 is a timing diagram of a signals of a skip logic circuit according to an embodiment of the present disclosure. The signals shown in the timing diagram 500 may show an example of signals which may be used by a skip logic circuit such as the skip logic circuit 400 of FIG. 4 which resets a count N each time, a periodic targeted refresh operation is skipped. The timing diagram 500 shows a variety of signals over time, with time extending along the x-axis from left to right. Each of the signals is shown as a separate trace, with a low logical level shown as a first level on the y-axis and a high logical level shown as a second level, of the y-axis which is above the first level (except for the count value N, which is shown as a numerical value).

The first trace shows the refresh management signal RFM, which is provided by a controller of the memory based on a rate of accesses to the memory. The second trace shows the signal REF_IP, which is used to indicate that a periodic targeted refresh operation has been skipped. The third trace shows the count value N over time. The fourth trace shows the signal Flag, which may be provided by a counter circuit (e.g., 444 of FIG. 4). The fifth trace shows the signal Skip, which may be provided by the skip logic circuit (e.g., 239 of FIG. 2).

Before an initial time t0, the value of the count N is at 0, and the signals REF_IP, Flag, and Skip are all at a low logical level. At t0, an activation of the signal RFM is received. This may indicate that the controller has counted a certain number of access commands directed to the bank. Responsive to the activation of RFM (e.g., responsive to a rising edge of RFM), the count value N is increased by one to a value of one. At a first time a second activation of the signal RFM is received. This may raise the value of N to two, which in this example embodiment is the threshold value N_th.

Since the value of N is now equal to or greater than N_th, the signal Flag is raised to a high logical level, which in turn raises the signal Skip to a high logical level. The signal skip rising to a high logical level may in turn reset the count value N to an initial value (e.g., 0). This may cause the signal Flag to drop to low logical level. The signal Skip may be provided to the RHR state control circuit to indicate that the next periodic targeted refresh operation should be skipped. At a second time t2, the signal REF_IP is provided to indicate that the memory device has performed periodic refresh operations, and that a periodic targeted refresh operation has been skipped. At a third time t1, responsive to a failing edge of the signal REF_IP, and the signal Flag no longer being at a high logical level, the signal Skip drops back to a low logical level.

Figure 6:
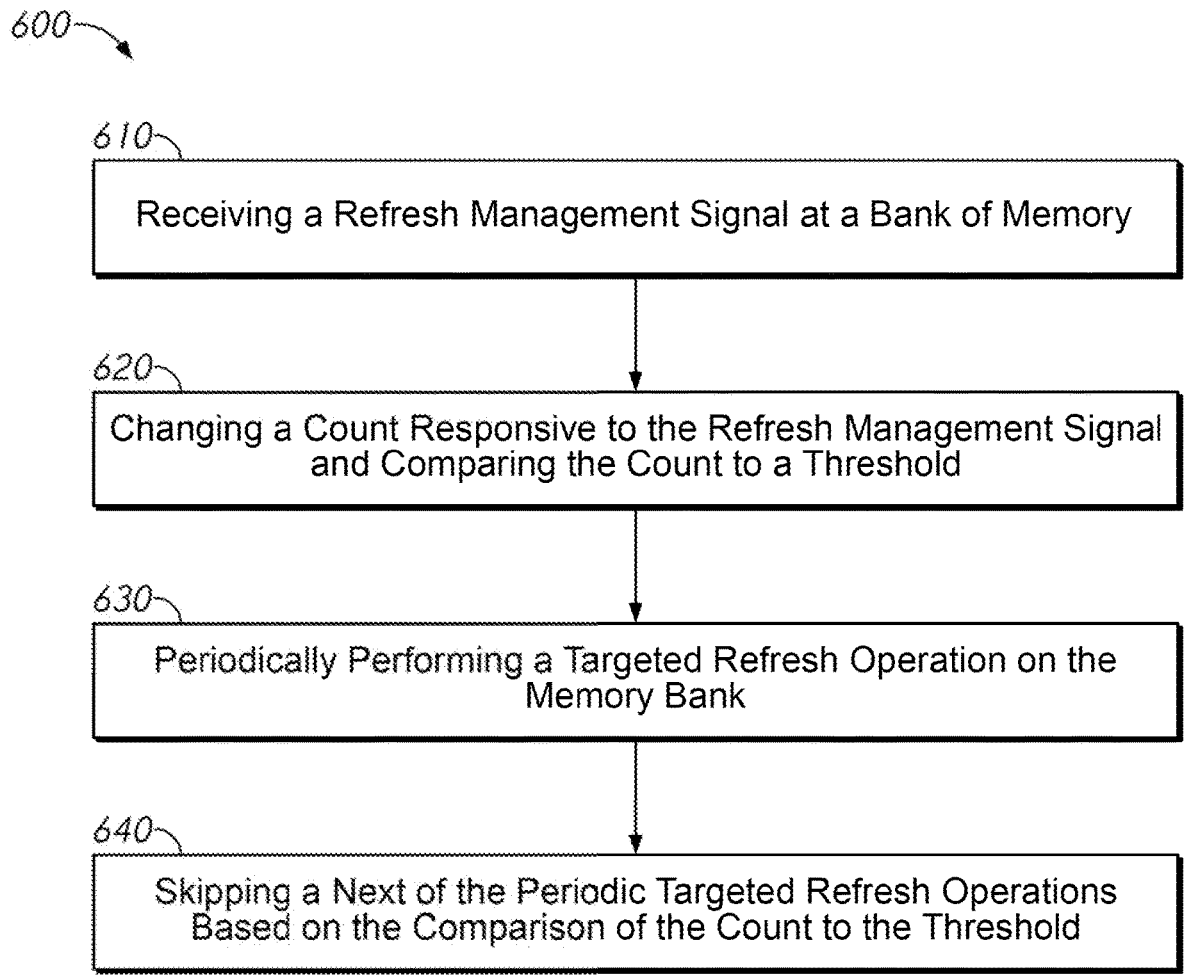
FIG. 6 is a flow chart of a method of dynamic targeted refresh steals according to an embodiment of the present disclosure.

FIG. 6 is a flow chart of a method of dynamic targeted refresh steals according to an embodiment of the present disclosure. The method 600 may be implemented by the device 100 of FIG. 1 in some example embodiments.

The method 600 may include block 610 which describes receiving a refresh management signal at a bank of a memory. The refresh management signals may be based on access commands to a particular bank of the memory. The access commands may be access commands associated with, for example, reading or writing data to/from one or more word lines of the bank. The access commands may be provided by a controller (e.g., interface 226 of FIG. 2). The memory bank may include an access period where the access commands are sent and received, and a refresh mode period, where one or more refresh operations are performed. A pattern of access periods and refresh modes may repeat.

The refresh management signal may be based on a first count responsive to the access commands and comparing the first count to a threshold. The controller may include the first count value e.g., RAA). In some embodiments, each time the access command is provided to a particular bank of the memory, the first count value may be increased (e.g., increased by one). The first count value may be compared to a first threshold (e.g., RAAIMT) and may determine if the first count RAA is greater than or equal to the first threshold RAAIMT. The refresh management signal (e.g., RFM) may be provided when the count is greater than the first threshold.

Block 610 may be followed by block 620 which describes changing a count responsive to the refresh management signal and comparing the count to a threshold. The refresh control circuit may include a skip logic circuit (e.g., 239) which manages the count value (e.g., N). In some embodiments, responsive to each refresh management signal (e.g., RFM), the count value N may be increased. The count value may be compared to a threshold (e.g., N_th) to determine if the count value is greater than or equal to the second threshold N_th.

Block 620 may be followed by block 630, which describes periodically performing a targeted refresh operation on the memory bank. The memory bank may be put into a refresh mode, where periodic refresh operations are performed. An interface may put the memory bank into the refresh mode by providing a refresh signal (e.g., AREF). While performing refresh operations, some of the refresh operations may be auto-refresh operations and some may be targeted refresh operations. The memory bank may receive access commands for a period of time, then be in a refresh mode for a period of time, and then this may repeat.

Block 630 may be followed by block 640, which describes skipping a next of the periodic targeted refresh operations based on the comparison of the second count to the second threshold. In some embodiments, when the second count is greater than or equal to the second threshold, the next periodic targeted refresh operation may be skipped. In some embodiments, after the next periodic targeted refresh operation is skipped, the count value N may be decreased. For example, the count value N may be decreased by the threshold N_th. In, another example, the count value N may be decreased by resetting the value of N to an initial value (e.g., 0).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims,

What is claimed is:

1. An apparatus comprising:
   a memory bank;
   a refresh state control circuit associated with the memory bank, the refresh state control circuit configured to periodically provide a targeted refresh signal and also provide the targeted refresh signal responsive to receiving a refresh management signal; and
   a skip logic circuit configured to provide a skip signal based, in part, on a number of times the refresh management signal is received, wherein the refresh state control circuit is configured to skip providing a next of the targeted refresh signals responsive to the skip signal.

2. The apparatus of claim 1, wherein the periodically provided targeted refresh signal is while the apparatus is in a first mode.

3. The apparatus of claim 2, wherein the next of the targeted refresh signals is during the first mode.

4. The apparatus of claim 2, wherein the skip logic circuit is configured to provide the skip signal based, in part, on the number of times the refresh management signal is received before the apparatus is in the first mode.

5. The apparatus of claim 1, wherein a count of the number of times the refresh management signal is received is decreased based, at least in part, on the next targeted refresh signal being skipped, and wherein the skip signal is provided based, at least in part, on the count.

6. The apparatus of claim 1, wherein the skip logic circuit is configured to provide the skip signal based on a comparison of the number of times the refresh management signal is received to a threshold.

7. The apparatus of claim 6, wherein the skip logic circuit is configured to increase a count of the number of times the refresh management signal is received responsive to the refresh management signal and configured to decrease the count of the number of times the refresh management signal is received by the threshold responsive to the next targeted refresh signal being skipped.

8. The apparatus of claim 1, wherein the refresh state control circuit is configured to provide a pulse of a command signal responsive to skipping the next targeted refresh signal.

9. The apparatus of claim 8, wherein the skip logic circuit is configured to reset the number of times the refresh management signal is received to an initial value responsive to receiving the pulse of the command signal.

10. The apparatus of claim 8, wherein the skip logic circuit is configured to reset the number of times the refresh management signal is received responsive to a falling edge of the pulse of the command signal.

11. The apparatus of claim 1, wherein the refresh management signal is provided based on a rate of access commands directed to the memory bank.

12. An apparatus comprising:
a memory bank;
an interface configured to provide a refresh management signal to the memory bank;
a refresh control circuit configured to:
indicate a number of refresh operations during a refresh mode;
indicate a refresh operation when the memory bank is not in the refresh mode based on the refresh management signal; and
reduce the number of the refresh operations during a next time the memory is in the refresh mode based on a number of times the refresh operation was indicated when the memory bank was not in the refresh mode.

13. The apparatus of claim 12, wherein the refresh operation indicated based on the refresh management signal is of a first type, and wherein the refresh control circuit is further configured to indicate a number of refresh operations including the first type of refresh operation and a second type of refresh operation when the bank is in the refresh mode.

14. The apparatus of claim 13, wherein the first type of refresh operation is a targeted refresh operation and wherein the second type of refresh operation is an auto-refresh operation.

15. The apparatus of claim 14, further comprising an aggressor detector circuit configured to identify an aggressor wordline of the memory bank, wherein during the first type of refresh operation at least one victim wordlines associated with the aggressor wordline is refreshed.

16. The apparatus of claim 12, further comprising:
a skip logic circuit configured to provide a skip signal based on a comparison of a count of the activations of the refresh management signal to a threshold,
wherein the refresh control circuit is configured to indicate the refresh operation when the memory bank is not in the refresh mode responsive to each activation of the refresh management signal, and
wherein the refresh control circuit is configured to reduce the number of the refresh operation responsive to the skip signal.

17. A method, comprising:
periodically providing a targeted refresh signal;
providing the targeted refresh signal responsive to receiving a refresh management signal;
providing a skip signal based, in part, on a number of times the refresh management signal is received; and
skipping a next targeted refresh signal responsive to the skip signal.

18. The method of claim 17, wherein the periodically provided targeted refresh signal is during a first mode.

19. The method of claim 18, wherein the next of the targeted refresh signals is during the first mode.

20. The method of claim 18, wherein the skip logic circuit is configured to provide the skip signal based, in part, on the number of times the refresh management signal is received before the first mode.

* * * * *